US007574638B2

(12) United States Patent
Song et al.

(10) Patent No.: US 7,574,638 B2
(45) Date of Patent: Aug. 11, 2009

(54) SEMICONDUCTOR DEVICE TESTED USING MINIMUM PINS AND METHODS OF TESTING THE SAME

(75) Inventors: Hae-Jin Song, Seongnam-si (KR); Jin-Tae Joo, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 524 days.

(21) Appl. No.: 11/345,897

(22) Filed: Feb. 2, 2006

(65) Prior Publication Data

US 2006/0184847 A1 Aug. 17, 2006

(30) Foreign Application Priority Data

Feb. 3, 2005 (KR) ...................... 10-2005-0010048
Feb. 4, 2005 (KR) ...................... 10-2005-0010748

(51) Int. Cl.
*G01R 31/28* (2006.01)

(52) U.S. Cl. ...................................... 714/724; 714/726

(58) Field of Classification Search ................. 714/724, 714/704, 706, 707, 731, 735, 736, 738, 742, 714/744, 819; 710/7, 20
See application file for complete search history.

(56) References Cited

U.S. PATENT DOCUMENTS 5,619,509 A * 4/1997 Maruyama et al. .......... 714/707
6,060,928 A * 5/2000 Jun et al. ..................... 327/261
6,408,415 B1 * 6/2002 Kim ........................... 714/738
2004/0017219 A1 1/2004 Han
2007/0237009 A1 * 10/2007 Lynch et al. ........... 365/189.12

FOREIGN PATENT DOCUMENTS

| | | |
|---|---|---|
| JP | 08015392 | 10/1996 |
| JP | 11296400 | 10/1999 |
| JP | 11326468 | 11/1999 |
| JP | 2000-304381 | 2/2000 |
| JP | 20020168925 | 6/2002 |
| KR | 1019950013606 | 11/1995 |
| KR | 20010105939 | 11/2001 |
| KR | 20020078884 | 10/2002 |
| KR | 20040002130 | 1/2004 |

* cited by examiner

*Primary Examiner*—Phung M Chung
(74) *Attorney, Agent, or Firm*—F. Chau & Associates, LLC

(57) ABSTRACT

The present invention provides semiconductor devices capable of being tested using one test pin and using an input/output pin without any test pins, and methods of testing the same. One semiconductor device comprises a test pin for inputting/outputting test data, an operation mode controller for activating an enable signal in response to an external reset signal and a clock signal, an operation mode storage for receiving serial data synchronized with the clock signal through the test pin in response to the enable signal, and an operation mode decoder for generating operation mode selection signals in response to the serial data stored in the operation mode storage. Another semiconductor device comprises an input/output pin for receiving test data, a delay reset signal generator for delaying a reset signal, a counter for counting a clock signal in response to the reset signal to generate a counted value, a mode register for storing the test data, and a decoder for generating selection signals to the mode register to designate a position in the mode register where the test data is written.

27 Claims, 11 Drawing Sheets

SEMICONDUCTOR DEVICE TESTED USING MINIMUM PINS AND METHODS OF TESTING THE SAME

CROSS-REFERENCE TO RELATED APPLICATIONS

This U.S. non-provisional patent application claims priority under 35 U.S.C. § 119 of Korean Patent Application 2005-10048 filed on Feb. 3, 2005 and Korean Patent Application 2005-10748 filed on Feb. 4, 2005, the contents of which are hereby incorporated by reference.

BACKGROUND OF THE INVENTION

1. Field of the Invention

The present invention relates to a system-on-chip and a method of testing the same, and more particularly to a system-on-chip capable of being tested using one test pin or without any test pins and a method of testing the same.

2. Description of the Related Art

Generally, system-on-chip size and power consumption may increase as pins are added to the chip. Therefore, it is preferable to reduce or remove one or more test pins that are only used to test devices.

In case of an image chip where pins are only provided to receive a clock signal and a reset signal, there is no spare pin for receiving test signals according to a test vector during a test. Thus, one or more pins are required to test an image chip.

Moreover, new technology needs to be developed to set various test modes without additional test pins because it is complex to set various test modes in a chip with a small number of pins such as the image chip only using a function pin as a test pin.

Since electronic devices such as mobile devices call for minimized sizes, it is desired that chips used in electronic devices be reduced in size. Where chips are decreased in size, it is complicated to properly arrange input/output pins such as data input/output pins and power supply pins on one or two sides. Thus, eliminating test pins is beneficial. Additionally, test items for chips in portable electronic devices have been increased, resulting in more test pins being included.

FIG. 1 shows a pin arrangement of a conventional system-on-chip having test pins disposed at three sides thereof and FIG. 2 shows a pin arrangement of a conventional system-on-chip having test pins disposed at two sides thereof.

A chip in FIG. 1 has a plurality of, for example, four test pins TEST_1 to TEST_4, a RESET pin, a CLK pin, and a plurality of input/output pins IO_1 to IO_7. The input/output pins IO_1 to IO_7 are dedicated to normal modes of operation. A chip in FIG. 2 has a test pin TEST, a reset pin RESET, a clock pin CLK, and a plurality of input/output pins IO_1 to IO_7. A part of the input/output pins IO_1 to IO_7 may be used for test modes of operation. If a chip has fewer input/output pins, it is complicated to perform test modes of operation based on a test system of FIG. 2.

SUMMARY OF THE INVENTION

An aspect of the present invention provides a system-on-chip capable of being tested using one test pin and a method of testing the same.

A semiconductor device in accordance with this aspect of the present invention comprises a test pin for inputting/outputting test data, an operation mode controller for activating an enable signal in response to an external reset signal and a clock signal, an operation mode storage for receiving serial data synchronized with the clock signal through the test pin in response to the enable signal, and an operation mode decoder for generating operation mode selection signals in response to the serial data stored in the operation mode storage.

In one exemplary embodiment, the operation mode controller comprises a bit counter for counting at rising edges of the clock signal in response to a low to high logic level transition of the reset signal, and a comparator for comparing an output value of the bit counter with an operation mode number to activate the enable signal when the output value is smaller than the operation mode number. In this embodiment, the operation mode number is determined by the serial data.

In one exemplary embodiment, the enable signal is in a high logic level from the low to high logic level transition of the reset signal until the counted value reaches the operation mode number.

In one exemplary embodiment, the operation mode storage shifts the serial data synchronized with the clock signal in response to the enable signal from the operation mode controller.

In one exemplary embodiment, the operation mode storage is set to indicate the operation modes.

In one exemplary embodiment, the operation mode storage is set to indicate lower operation modes belonging to the operation mode and a test target. In this embodiment, the test target is a component in the semiconductor device to be tested.

In one exemplary embodiment, the test target includes an input/output interface, a memory and an internal logic.

In one exemplary embodiment, the reset signal transitions from a low to a high logic level in synchronization with a falling edge of the clock signal CLK.

In one exemplary embodiment, the operation modes include a normal operation mode where the semiconductor device performs normal functions and the normal operation mode is indicated in the shift register.

In one exemplary embodiment, the semiconductor device further includes a multiplexer for outputting the operation mode selection signals in response to a high to low logic level transition of the enable signal from the operation mode controller.

Another aspect of the present invention provides a method of testing a semiconductor device, which comprises activating an enable signal in response to a reset signal, receiving serial data synchronized with a clock signal through a test pin in response to the enable signal, deactivating the enable signal by determining whether the serial data is completely input, and generating the operation mode selection signals responding to the serial data when the enable signal is deactivated.

In one exemplary embodiment, the enable signal is activated by a low to high logic level transition and deactivated by a high to low logic level transition.

In one exemplary embodiment, the step of generating the operation mode selection signals further comprises generating test signals.

In one exemplary embodiment, the test signals are for indicating lower operation modes of the operation modes set by the operation mode selection signals and test targets. In this embodiment, the test target is a component in the semiconductor device to be tested.

Another aspect of the present invention provides a system-on-chip capable of being tested using input/output pins without any test pins and a method of testing the same. A test circuit in accordance with this aspect of the present invention comprises an input/output pin for receiving test data in a test mode, a delay reset signal generator for delaying a reset signal, a counter for counting a clock signal in response to the reset signal to generate a counted value, a mode register for storing the test data, and a decoder for generating selection signals to the mode register to designate a position in the mode register where the test data is written.

In one exemplary embodiment, the test circuit further comprises an input/output controller, comprising a first tri-state buffer of which input terminal is connected to an internal logic and output terminal is connected to the input/output pin, sending the test data from the internal logic to the input/output pin, a second tri-state buffer of which input terminal is connected to the pin and output terminal is connected to the mode register, sending the test data from the pin to the test mode register, and an OR gate of which an output terminal is connected to enable terminals of the first and second tri-state buffers, a first input terminal is connected to the delay reset signal generator and a second input terminal is connected to the counter. In this embodiment, the first and second tri-state buffers are enabled by the output signal of the OR gate.

In one exemplary embodiment, the counter generates a count end signal to one output terminal of the OR gate when a value of the counter reaches a predetermined value. In this embodiment, the count end signal is in a high logic level.

In one exemplary embodiment, the delay reset signal generator outputs the delayed reset signal to the second output terminal of the OR gate and the delay reset signal generator delays the reset signal depending on a number of test modes.

In one exemplary embodiment, the counter has a value "0" while the reset signal is in a low logic level.

In one exemplary embodiment, the reset signal is delayed for at least $|\log_2 N|$ cycles of the clock signal and N is the number of the test modes.

Another aspect of the present invention provides a system-on-chip comprising an input/output pin for inputting and outputting test data, a clock input for receiving a clock signal, a reset input for receiving a reset signal, a delay reset signal generator for delaying the reset signal to generating a delay reset signal, an input/output controller for causing the input/output pin to function as an input pin during a time period from a low to high logic level transition of the reset signal to a low to high logic level transition of the delayed reset signal, a counter for counting the clock signal in synchronization with the low to high logic level transition of the reset signal, a mode register for storing the test data in response to the selection signals from the decoder, and a decoder for generating selection signals to designate a position of the mode register where the test data from the input/output controller depending on an output value of the counter.

In one exemplary embodiment, the system-on-chip further comprises a first tri-state buffer of which an input terminal is connected to the input/output controller and an output terminal is connected to the input/output pin, sending the test data output from the internal logic to the input/output pin, a second tri-state buffer of which an input terminal is connected to the input/output pin and an output terminal is connected to the test mode register, sending the test data from the input/output pin to the mode register, and an OR gate of which an output terminal is connected to enable terminals of the first and second tri-state buffers, a first input terminal is connected to the delay reset signal generator, and a second input terminal is connected to the counter. In this embodiment, the first and second tri-state buffers are enabled by the output signal of the OR gate.

In one exemplary embodiment, the counter generates a count end signal of a high logic level to the first output terminal of the OR gate when the counted value reaches a predetermined value.

In one exemplary embodiment, the delay reset signal generator delays the reset signal depending on a number of test modes and the counter has a value "0" while the reset signal is in a low logic level.

In one exemplary embodiment, the delay reset signal generator delays the reset signal for at least $|\log_2 N|$ cycles of the clock signal and N is the number of test modes.

In one exemplary embodiment, the system-on-chip further comprises a demultiplexer of which an input terminal is connected to the input pin, a first output terminal is connected to the internal logic, and a second output terminal is connected to the test mode register. In this embodiment, the demultiplexer is enabled by a logical combination of the count end signal and the delayed reset signal and the input/output pin functions as an input pin.

BRIEF DESCRIPTION OF THE DRAWINGS

The accompanying drawings are included to provide a further understanding of the invention, to illustrate exemplary embodiments of the present invention and, together with the description, to explain principles of the present invention. In the drawings.

DETAILED DESCRIPTION OF PREFERRED EMBODIMENTS

Preferred embodiments of the present invention will be described below in detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, an exemplary embodiment of the present invention that provides a system-on-chip capable of being tested using one test pin to reduce the size of a chip, and a method of testing the same will be described.

Figure 3:
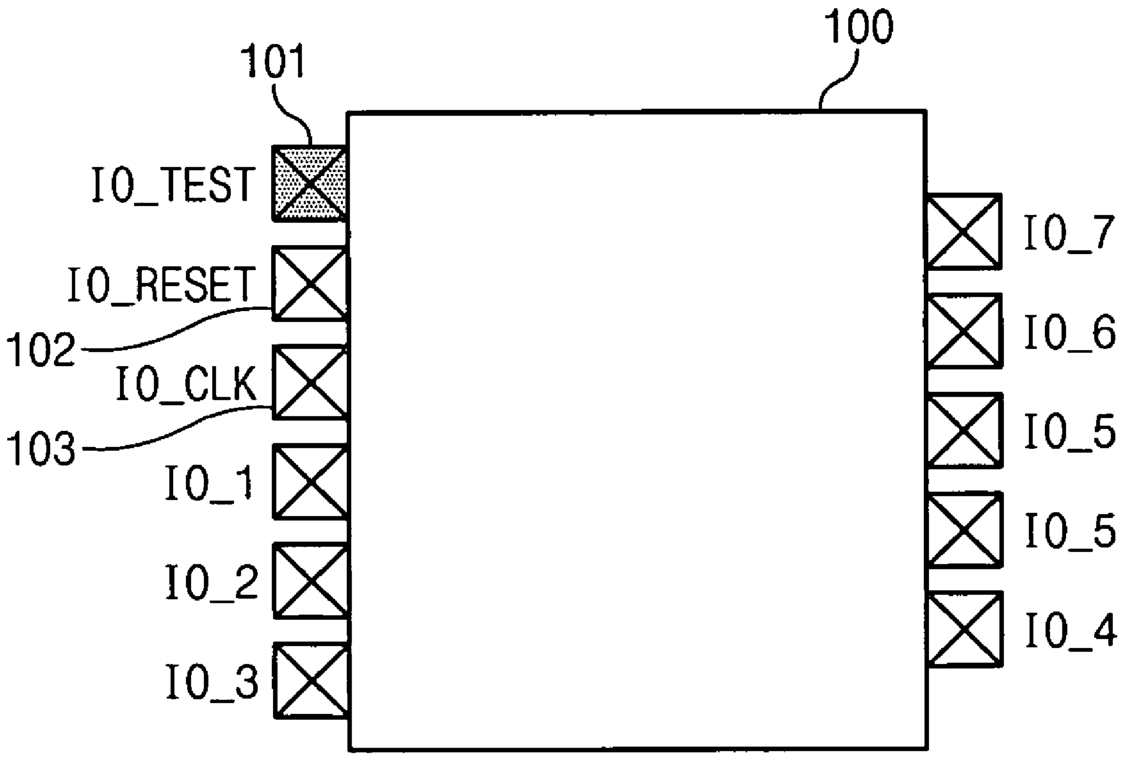
FIG. 3 shows a pin arrangement of a system-on-chip in accordance with the present invention.

FIG. 3 shows a pin arrangement of a system-on-chip in accordance with the present invention. Referring to FIG. 3, the system-on-chip 100 includes a test pin IO_TEST, a reset pin IO_RESET, a clock input pin IO_CLK, and a plurality of, for example, seven input/output pins IO_1 to IO_7. In order to set a test mode of operation for the system-on-chip 100, serial data SD is input through the test pin IO_TEST. During a test mode of operation, the plurality of input/output pins IO_1 to IO_7 is not used.

Figure 4:
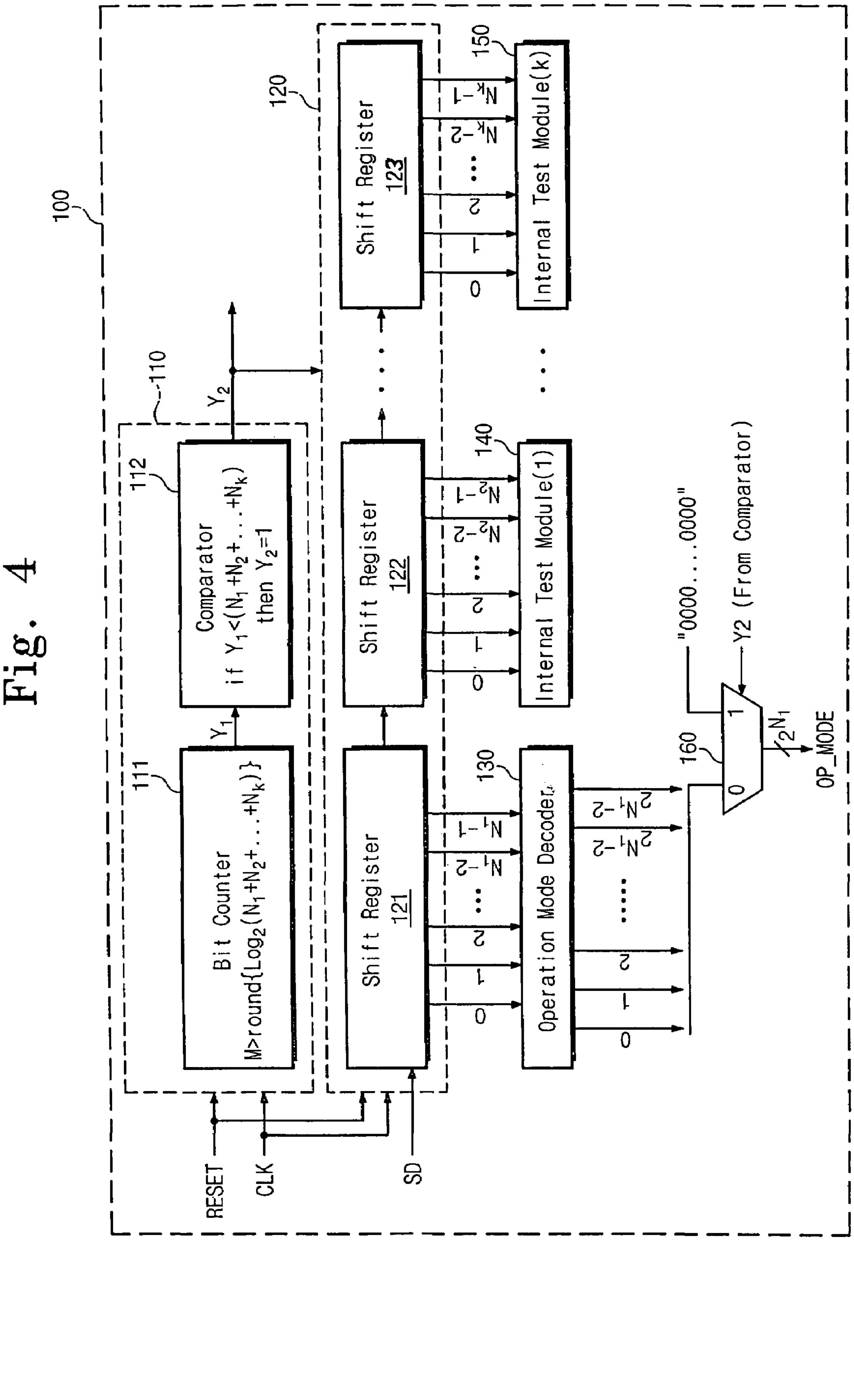
FIG. 4 is a block diagram illustrating an internal structure of the system-on-chip of FIG. 3 in accordance with the present invention.

FIG. 4 is a block diagram illustrating an internal structure of the system-on-chip of FIG. 3 in accordance with the present invention. Referring to FIG. 4, the system-on-chip 100 includes an operation mode controller 110, an operation mode storage 120, an operation mode decoder 130, a multiplexer 160, and a plurality of, for example, k internal test modules 140 to 150.

In this exemplary embodiment, it is assumed that signals needed for setting modes of operation have $\log_2 N$ bits ($N=N_1+N_2+ \ldots +N_k$, i.e., an operation mode number). The operation mode controller 110 includes a bit counter 112 and a comparator 112. The bit counter 111 starts in synchronization with a low to high logic level transition of a reset signal RESET that is input through the reset pin IO_RESET in FIG. 3. The bit counter 111 counts at rising edges of a clock signal CLK, which is received through a reset pin IO_RESET, to generate a count value Y1 to the comparator 112. The number of bits M of the bit counter 111 is an integer of '$\log_2 N$'.

The comparator 112 compares the output value Y1 of the bit counter 111 with the operation mode number N. If the output value Y1 is smaller than the operation mode number N, the comparator 112 generates an enable signal Y2. In this case, the enable signal Y2 has a high logic level ("1"). The operation mode storage 120 includes k+1 shift registers 121 to 123 that operate in response to the enable signal Y2. The k+1 shift registers 121 to 123 shift externally input serial data SD sequentially in synchronization with the clock signal CLK when the reset signal RESET is disabled (i.e., when the reset signal RESET has a low to high logic level transition). The k+1 shift registers 121 to 123 stop when the output value Y1 of the bit counter 111 in the operation mode storage 120 reaches the operation mode number N. That is, the $k+_1$ shift registers 121 to 123 operate while the enable signal Y2 is in a high logic level. One of the k+1 shift registers 121 to 123 is set to indicate at least one operation mode. FIG. 4 illustrates one example where the shift register 121 is set to indicate operation modes. In other words, while the enable signal Y2 is in a high logic level, the shift register 121 shifts the serial data SD sequentially in synchronization with the clock signal CLK and outputs N1 numbers of serial data SD to the operation mode decoder 130. The shift register 122 shifts serial data SD sequentially in synchronization with the clock signal CLK and outputs N2 serial data SD to an internal test module 140. Likewise, the shift register 123 outputs $N_k$ serial data SD to the internal test module 150.

The operation mode decoder 130 receives the N1 serial data SD from the shift register 121 to output 2N1 operation mode selection signals to the multiplexer 160. The internal test module 140 receives the N2 serial data SD from the shift register 122 to generate 2N2 test signals and the internal test module 150 generate $2N_k$ test signals. Each of the k internal test modules 140 to 150 is a device for testing a selected target in the system-on-chip 100 in each predetermined test mode.

The multiplexer 160 is activated by the enable signal R2 of the operation mode controller 110 and fixes the output OP_MODE to a constant value (e.g., "0000 . . . 0000") until a shift operation of the operation mode storage 120 is completed. If not, an output of an operation mode decoder 130 is changed. This may cause some problems during a test operation because an undesired operation mode can be set according to the output of the operation mode decoder 130.

Figure 5:
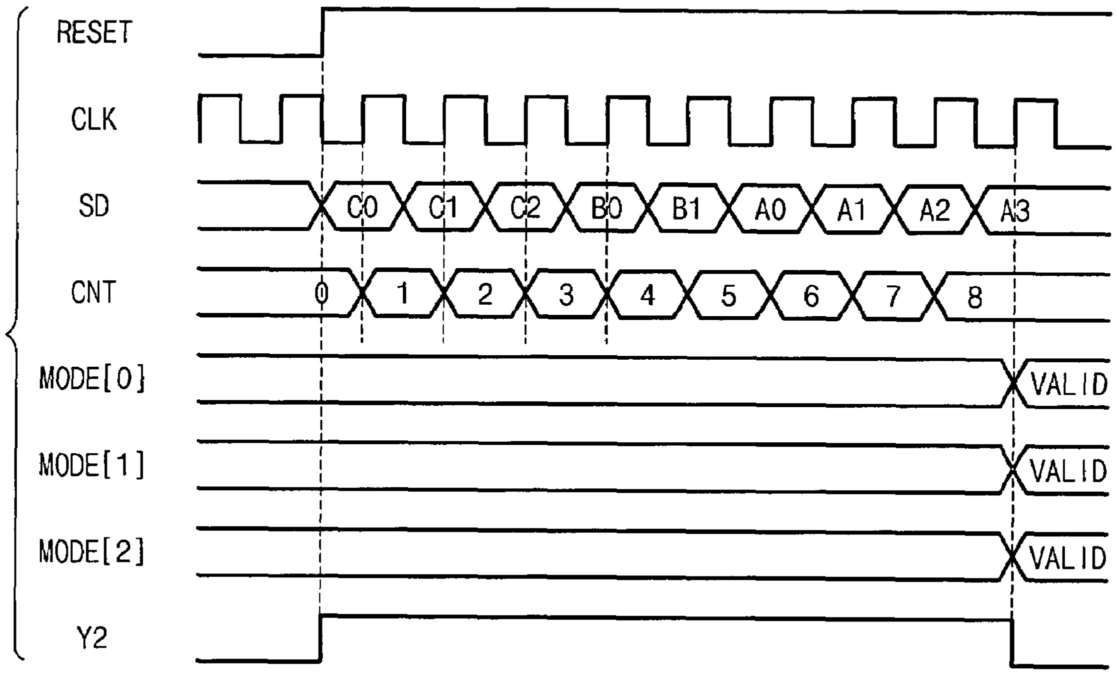
FIGS. 5 and 6 are timing diagrams in accordance with the present invention.
Figure 6:
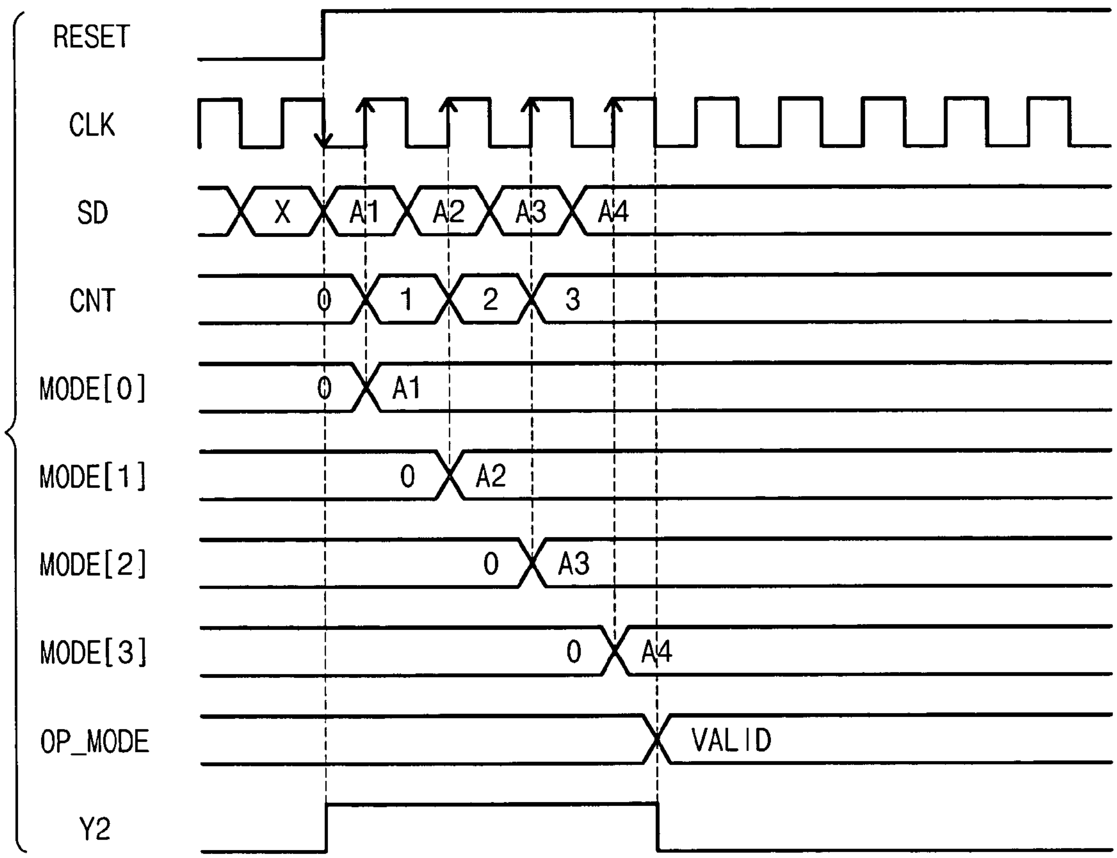

FIGS. 5 and 6 are timing diagrams in accordance with the present invention. For brevity, assume that an operation mode storage 120 in FIG. 4 includes four shift registers and that the operation mode number N is 9. Referring to FIG. 5, the bit counter 111 in the operation mode control 110 in FIG. 4 counts in synchronization with each rising edge of a clock signal. The reset signal RESET is disabled at a falling edge of the clock signal CLK to guarantee a removal/recovery margin. The bit counter 111 operates in synchronization with a rising edge of the clock signal CLK, and serial data SD is input through a test pin IO_TEST at the falling edge of the clock signal CLK to guarantee a setup/hold margin.

The serial data SD is sequentially shifted in synchronization with the clock signal CLK. Some of the serial data C0, C1, and C2 are set in a shift register 123, the other B0 and B1 in a shift register 122, and the rest A0, A1, A2 and A3 in a shift register 121. Outputs SEL2 and SEL3 of the shift register 122 and 123 indicate lower operation modes of a specific operation mode or selects a lower test target. An output signal OP_MODE of the multiplexer 160 is fixed to a constant value until the registers 121,122 and 123 are set in accordance with serial data SD. This is because the output of the operation mode decoder 130 is not changed.

As fully described above, in a test mode when serial data SD is input through a test pin IO_TEST according to a test vector, timing among a reset signal RESET, a clock signal CLK and serial data SD may be easily adjusted. However, it is complicated to change timing according to a clock signal CLK in a normal operation mode in which the chip operates and the serial data SD is fixed to a constant value of logic "0" or "1". Therefore, the values A0, A1, A2 and A3 of the register 121 indicating a specific operation mode are defined to a logic "0" or a logic "1".

Assume that the number of the shift registers in FIG. 4 is one and an operation mode number N is four. Referring to FIG. 6, a bit counter 111 in an operation mode controller 110 performs a count operation at rising edges of the clock signal CLK. The reset signal RESET is disabled at a falling edge of the clock signal CLK. The bit counter 111 operates at a rising edge of the clock signal CLK, the serial data SD is input through the test pin IO_TEST at a falling edge of the clock signal. Therefore, a setup/hold margin related to the serial data SD is sufficiently guaranteed.

The serial data SD is sequentially shifted in synchronization with the clock signal CLK to be set in the shift register 121. The values A0, A1, A2, and A3 each indicate lower operation modes and a normal operation. In each lower operation mode, an input/output interface, a memory and an internal logic operate are tested, respectively. An output signal OP_MODE of the multiplexer 160 is fixed to a constant value until the shift register 121 is set completely.

Hereinafter, a system-on-chip capable of being tested using input/output pins of the chip without test pins and a method of the same will be described.

Figure 7:
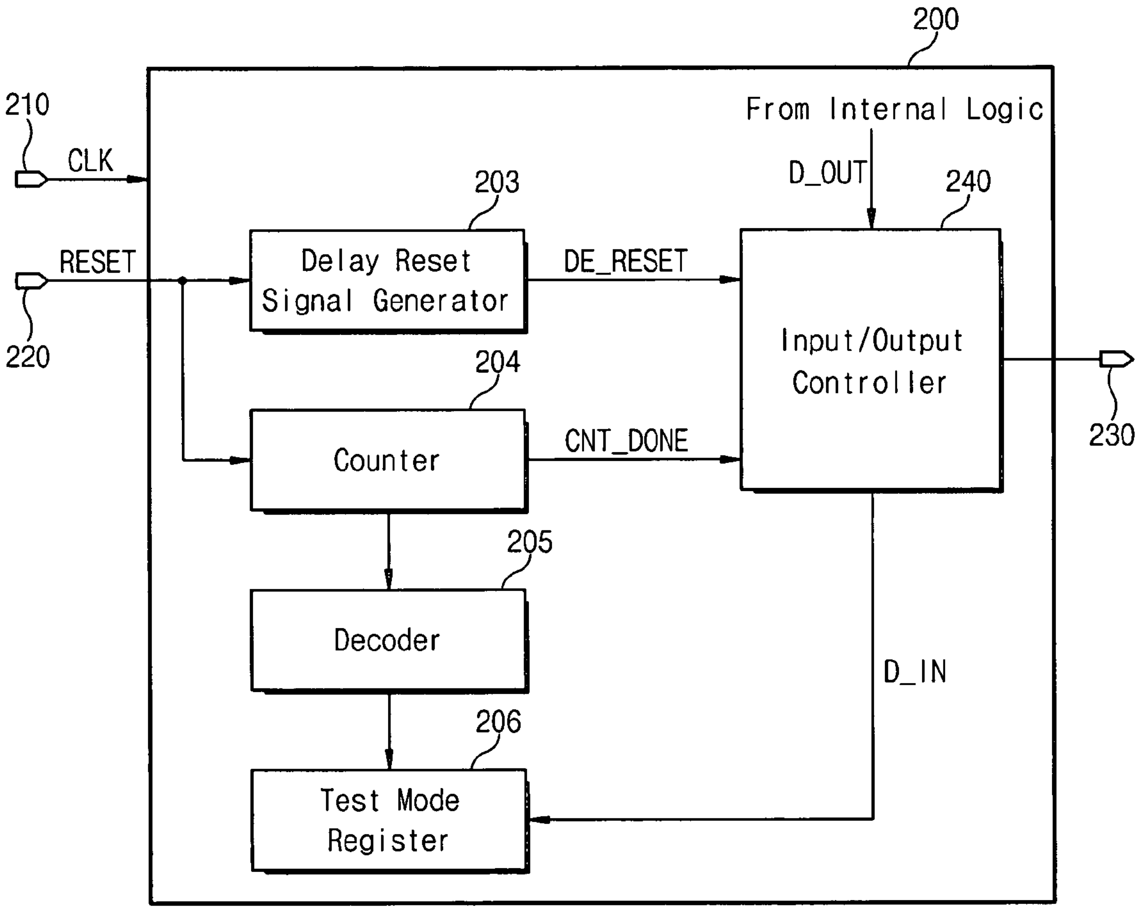
FIG. 7 is a block diagram of a system-on-chip in accordance with another embodiment of the present invention.

FIG. 7 is a block diagram of a system-on-chip in accordance with another embodiment of the present invention. Referring to FIG. 7, the system-on-chip 200 of the present invention includes a delay reset signal generator 203, a counter 204, a decoder 205, a test mode register 206, an input/output controller 240, a clock signal input pin 210, a reset signal input pin 220, and an input/output pin 230.

The clock signal input pin 210 receives a clock signal CLK generated from an oscillator (not shown). The clock signal CLK is used for synchronizing inputs to the counter 204 and the test mode register 206. The reset signal input pin 220 receives an external reset signal RESET, which is applied to the delay reset signal generator 203 and the counter 204. The reset signal RESET is used for determining a time when data indicating a test mode is set in the test mode register 206. The input/output pin 230 is connected to the input/output controller 240. The input/output controller 240 fixes the input/output pin 230 as an input pin for receiving an external test data D_IN while the test mode is set. The input/output controller 240 fixes the input/output pin 230 as an output pin for sending the output data D_OUT from an internal logic to an external memory after the test mode is completely set.

The delay reset signal generator 203 delays the reset signal RESET input from the reset input pin 220 and outputs a delayed reset signal DE_RESET to the input/output controller 230. The reset signal RESET is delayed over a cycle that corresponds to an absolute value of $\log_2 N$ clock cycles, the number of test modes in the chip. That is, the delay reset signal generator 203 delays the reset signal RESET for a time to set the test mode in the chip. When the number of test modes is six, for example, the number of bits needed for setting the test mode register is three. Thus, the reset signal RESET is delayed over three cycles. In addition, the delay reset signal generator 203 determines the time when a setting of the input/output pin 230 is changed from an input to an output. The counter 204 is set to maintain a value "0" during an interval when the reset signal RESET is in a low logic level. The counter 204 counts when a reset signal RESET transitions from a low to a high logic level. The counter 204 outputs the counted value to the decoder 205 and generates a count end signal CNT_DONE if the counted value reaches an absolute value of $\log_2 N$, the number of test modes in the chip. When the count end signal CNT_DONE is input to the input/output controller 240, the input/output controller 240 changes the setting of the input/output pin 230 from input to output.

The decoder 205 generates a selection signal for selecting a specific position of the test mode register 206 where the test data D_IN from the input/output controller 240 is stored. The test mode register 206 stores the test data D_IN synchronized with the clock signal CLK in response to the selection signal from the decoder 205. As described above, the number of bits of the test mode register 106 is over an absolute value of $\log_2 N$, the number of test modes in the chip.

Figure 8:
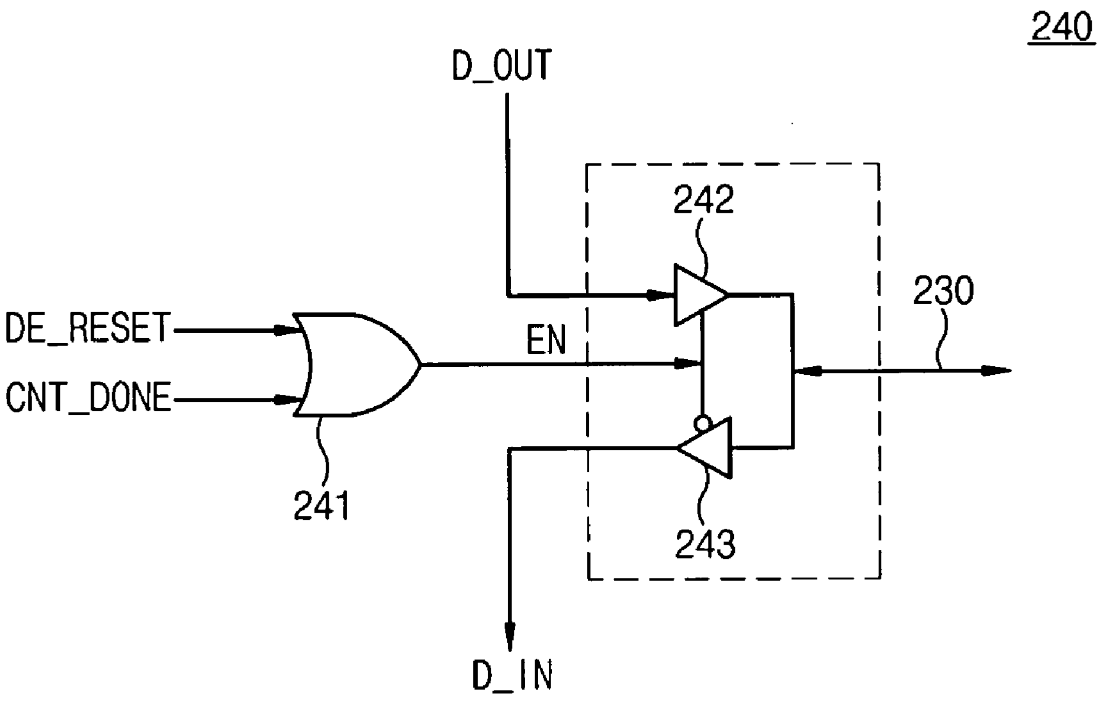
FIG. 8 is a circuit diagram of an input/output controller of FIG. 7 in accordance with another embodiment of the present invention.

FIG. 8 is a circuit diagram of an input/output controller of FIG. 7 in accordance with another embodiment of the present invention. Referring to FIG. 8, the input/output controller 240 includes first and second tri-state buffers 242 and 243 and an OR gate 241. An input terminal of the first tri-state buffer 242 is connected to an input/output pin 230 and an output terminal thereof is connected to a test mode register 206. An output terminal of the OR gate 241 is connected to enable terminals of the first and second tri-state buffers 242 and 243 and one input terminal of the OR gate 241 is connected to a delay reset signal generator 203. The first and second tri-state buffers 242 and 243 are enabled or disabled by an output signal of the OR gate 241. The output signal of the OR gate 241 is a logically combined signal of the delayed reset signal DE_RESET from the delay reset signal generator 203 and the count end signal CNT_DONE from the counter 204. When one of the delayed reset signal DE_RESET and the count end signal CNT_DONE is in a high logic level, the first tri-state buffer 242 is enabled to output the output data D_OUT from the internal logic to an external device such as an external memory through the input/output pin 230. When both of the delayed reset signal DE_RESET and the count end signal CNT_DONE are in a low logic level, the second tri-state buffer 243 is enabled to send the test data D_IN input through the input/output pin 230 to a test mode register 206.

Figure 9:
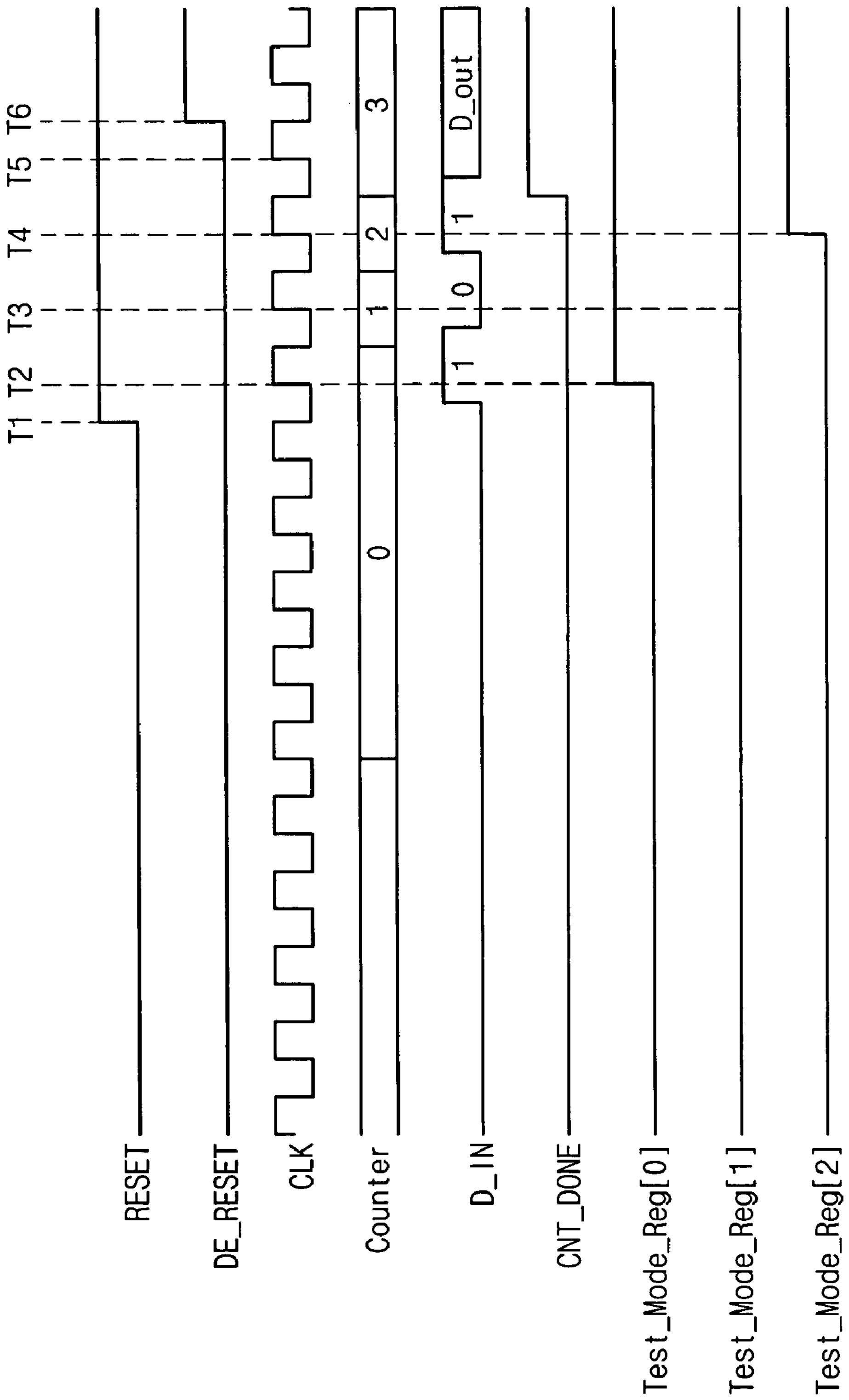
FIG. 9 is a timing diagram of the system-on-chip of FIG. 7 in accordance with another embodiment of the present invention.

FIG. 9 is a timing diagram of the system-on-chip of FIG. 7 in accordance with another embodiment of the present invention. In FIG. 9, assume that the number of the test modes is 5-8 and one test mode is stored in a predetermined position of the mode register 106 (e.g., a register bit [2:0]) as binary data '101'.

Referring to FIGS. 7 and 9, a reset signal RESET of a low logic level is applied to a chip through a reset input pin 220 and a time elapses. A reset signal RESET transitions from a low to a high logic level (at T1). Generally, the chip operates normally at the low to high logic level transition of the reset signal RESET. However, according to the present invention, the reset signal RESET is delayed as a predetermined time by the delay reset signal generator 203 (at T6). Therefore, values indicating the test modes are set in the test mode register 206 between the time T1 when the reset signal RESET transitions from a low to a high logic level and the time T6 when the delayed reset signal DE_RESET transitions from a low to a high logic level. The input/output pin 230 functions as an input pin between the time T1 and the time T6. At T1, the counter 204 starts a count operation. The counter 204 counts at rising edges after T1 in synchronization with the clock signal CLK. The decoder 205 generates selection signals for selecting a predetermined position of the test mode register 206 where the test data D_IN input through the input/output pin 230 is recoded according to the counted values. A value of {1, 0, 1} is recoded in the least significant bit (LSB) of the test mode register 206. Since the output of the counter 204 is "0" at T2, a value "1" of the test data D_IN is written in [0] of the test mode register 206. Since a value of the counter is "1" at T3, a value "0" of the test data D_IN is written in [1] of the test mode register 206. Since a value of the counter is "2" at T4, a value "1" of the test data D_IN is written in [2] of the test mode register 206. When the counted value reaches an absolute value of $\log_2 N$, the number of test modes in the chip, the counter 204 sends a count end signal CNT_DONE in a high logic level to the input/output controller 240. The input/output controller 240 causes the input/output pin 230 to function as an output pin in response to the count end signal CNT_DONE.

Figure 1:
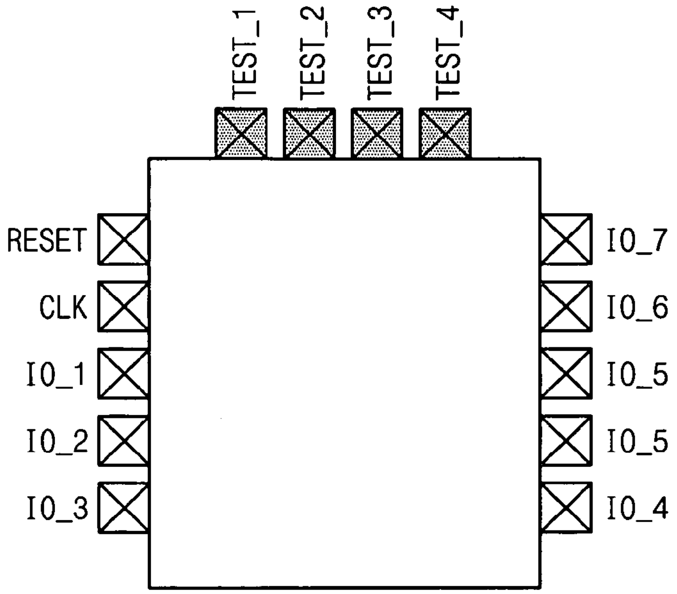
FIG. 1 shows a pin arrangement of a conventional system-on-chip having test pins disposed at three sides thereof.
Figure 2:
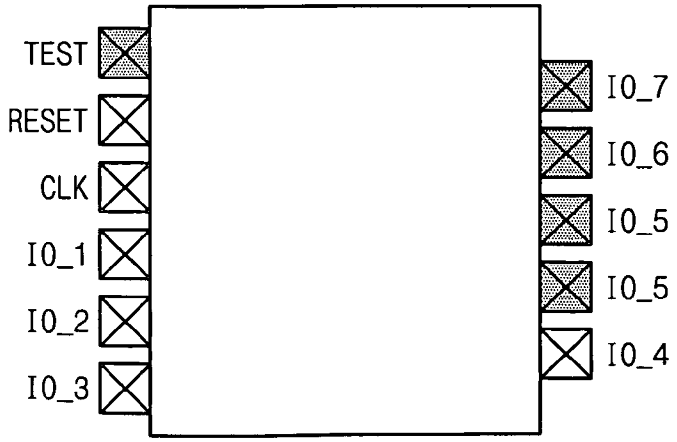
FIG. 2 shows a pin arrangement of a conventional system-on-chip having test pins disposed at two sides thereof.
Figure 10:
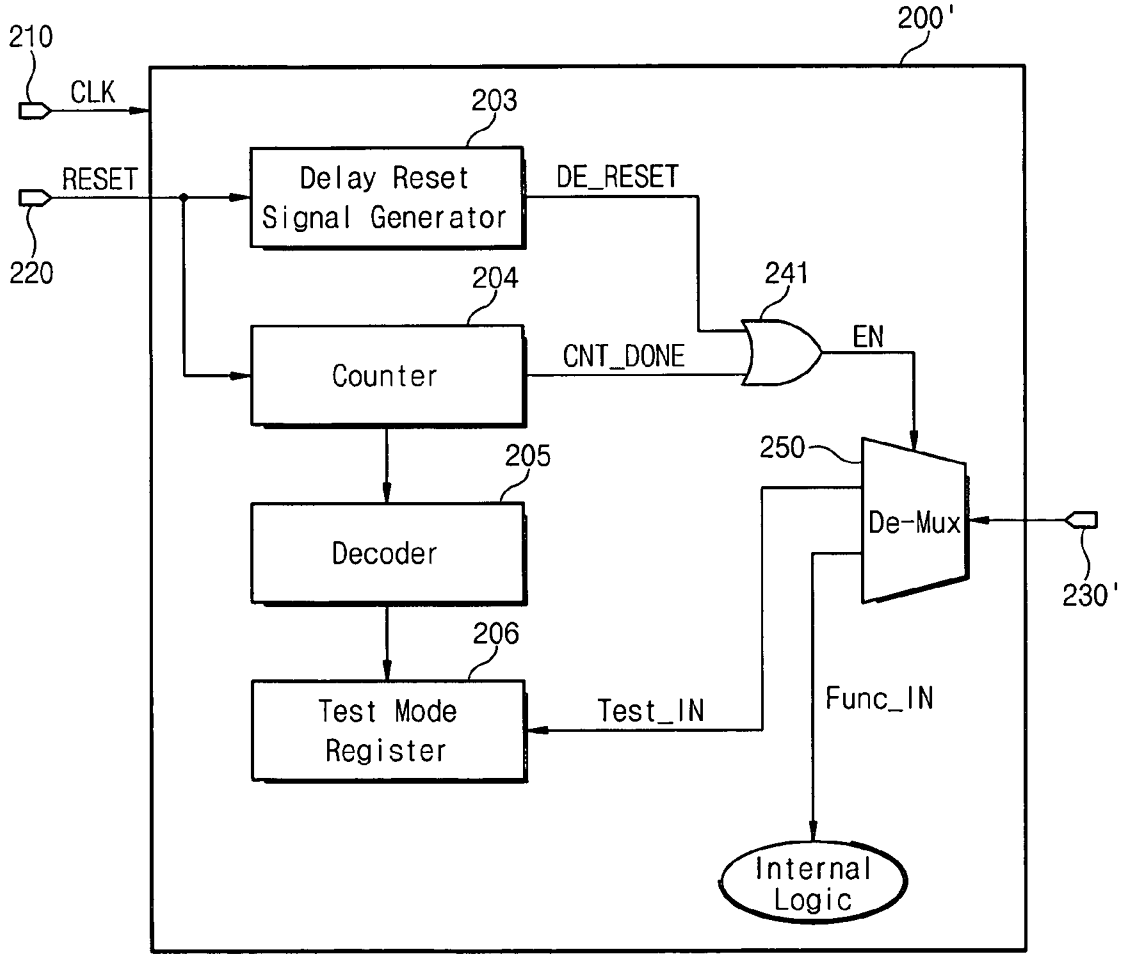
FIG. 10 is a block diagram of a system-on-chip in accordance with another embodiment of the present invention.

FIG. 10 is a block diagram of a system-on-chip in accordance with another embodiment of the present invention. Referring to FIG. 10, the system-on-chip 200' of the present invention has a structure similar to the system-on-chip 200 in FIG. 1. However, the system-on-chip 200' has an input pin 230' instead of the input/output pin 230 and a demultiplexer 250 instead of the input/output controller 240. The components described with reference to FIG. 7 will not be further described and the same components as those in FIG. 7 are marked with the same reference numbers in FIG. 7.

The input pin 230' connected to the demultiplexer 250 functions as a test pin for receiving external test data Test_IN while the test mode is set and functions as an input pin for receiving input data Func_IN sent to an internal logic circuit after the test mode is completely set. The delay reset signal generator 203 delays the reset signal RESET input from the reset input pin 220 to send the delayed reset signal DE_RESET to an OR gate 241. The delay reset signal generator 203 generates the delayed reset signal DE_RESET determining a time when the input pin 230' changes its role from the test pin to a normal operation pin. A count end signal CNT_DONE generated from the counter 204 is applied to the OR gate to change the role of the input pin 230' from the test pin to the input pin. An input terminal of the demultiplexer 250 is connected to the input pin 230' and a first output terminal thereof is connected to the internal logic circuit. A second output terminal of the demultiplexer 250 is connected to the test mode register 206. The demultiplexer 250 controls data received through the input pin 230' in accordance with the enable signal EN that is a logically combined signal of the count end signal CNT_DONE from the counter 204 and the delayed reset signal DE_RESET from the delay reset signal generator 203. That is, when the enable signal EN is in a low logic level, a first output terminal of the demultiplexer 250 is activated to send the test data TEST_IN to the test mode register 206. Meanwhile, when enable signal EN is in a high logic level, a second output terminal of the demultiplexer 250 is activated to send the input data Func_IN received through the input pin 230' in a normal operation mode to the internal logic.

Figure 11:
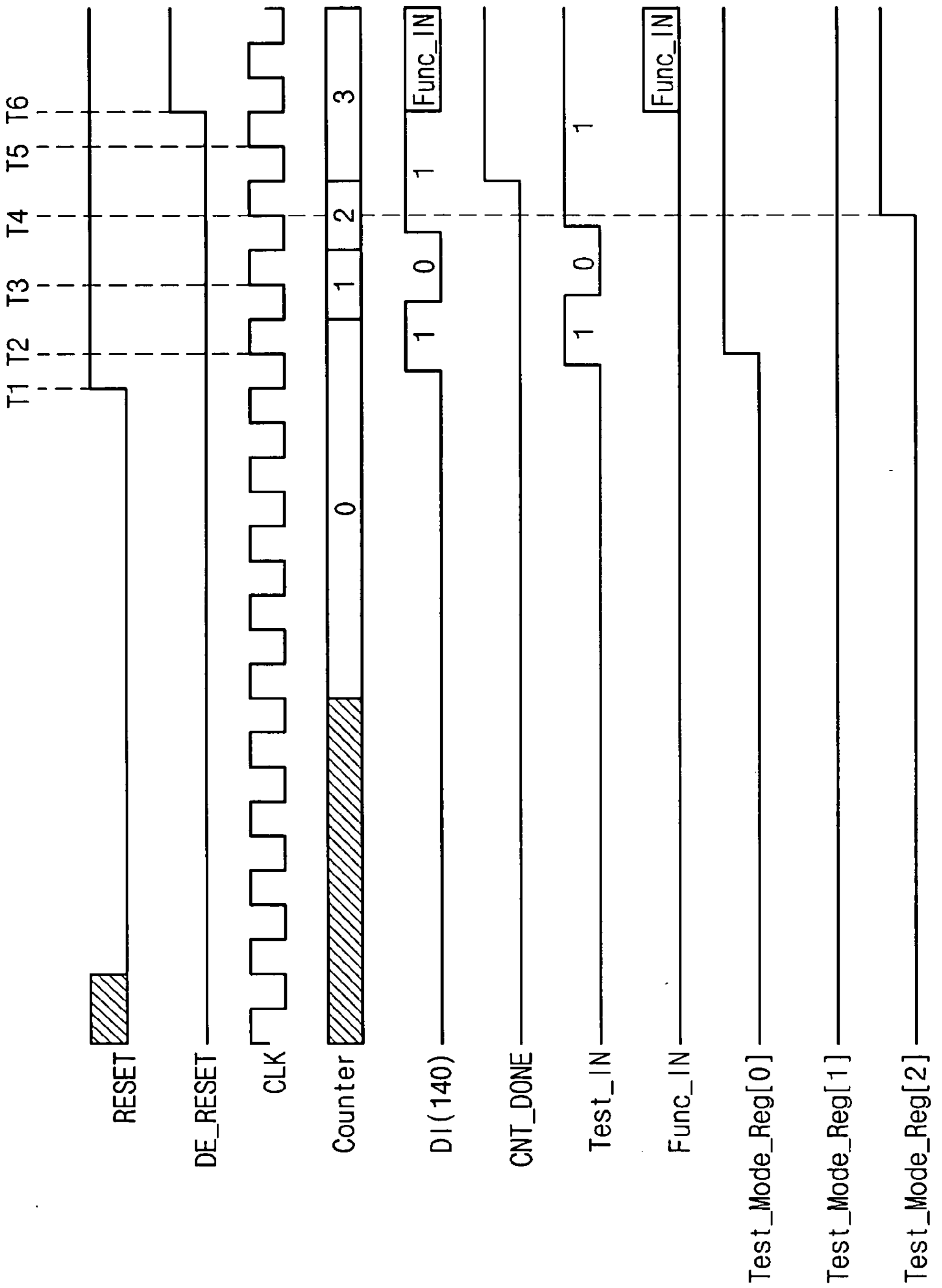
FIG. 11 is a timing diagram of the system-on-chip of FIG. 10 in accordance with another embodiment of the present invention.

FIG. 11 is a timing diagram of the system-on-chip of FIG. 10 in accordance with another embodiment of the present invention. Assume that the number of test modes is 5-8 and binary data “101” indicating one test mode is recorded in a predetermined position of the test mode register 206 (e.g., [2:0]).

Referring to FIGS. 10 and 11, a reset signal RESET in a low logic level is applied to a chip through the reset input pin 220 and a time elapses. The reset signal RESET transitions from a low to a high logic level at T1. Generally, the chip starts normal operations when the reset signal transitions from a low to a high logic level. However, the reset signal RESET is delayed for a predetermined time T6 by the delay reset signal generator 203. Therefore, the values indicating test modes are set in the test mode register 206 between a time T1 and the time T6. The reset signal RESET transitions from a low to a high logic level at T1 and the delayed reset signal transition from a low to a high logic level at T6. The input pin 230' functions as a test pin between T1 and T6. The counter 204 starts counting at T1. The counter 204 counts at rising edges of the clock signal CLK after T1 in synchronization with clock signal CLK. The decoder 205 determines a specific position of the test mode register 106 where the test data Test_IN input through the input pin 230' in accordance with the counted value by the counter 204. In other words, the values {1, 0, 1} are written in the test mode register 206 from the LSB sequentially. Since the value of the counter is “0” at T2, a value “1” of the test data Test_IN is written in [0] of the test mode register. Since the value of the counter is “1” at T3, a value “1” of the test data Test_IN is written in [1] of the test mode register. Since the value of the counter is “2” at T4, a value “1” of the test data Test_IN is written in [2] of the test mode register.

When the counted value reaches an absolute value of $\log_2 N$, the number of test modes in the chip, the counter 204 sends a count end signal CNT_DONE in a high logic level to the OR gate 241. When the count end signal CNT_DONE is applied to the demultiplexer, the input pin 230' recovers it function as a normal input pin for receiving data Func_IN sent to the internal logic. Accordingly, the present invention can set various test modes without an additional test pin.

Figure 12:
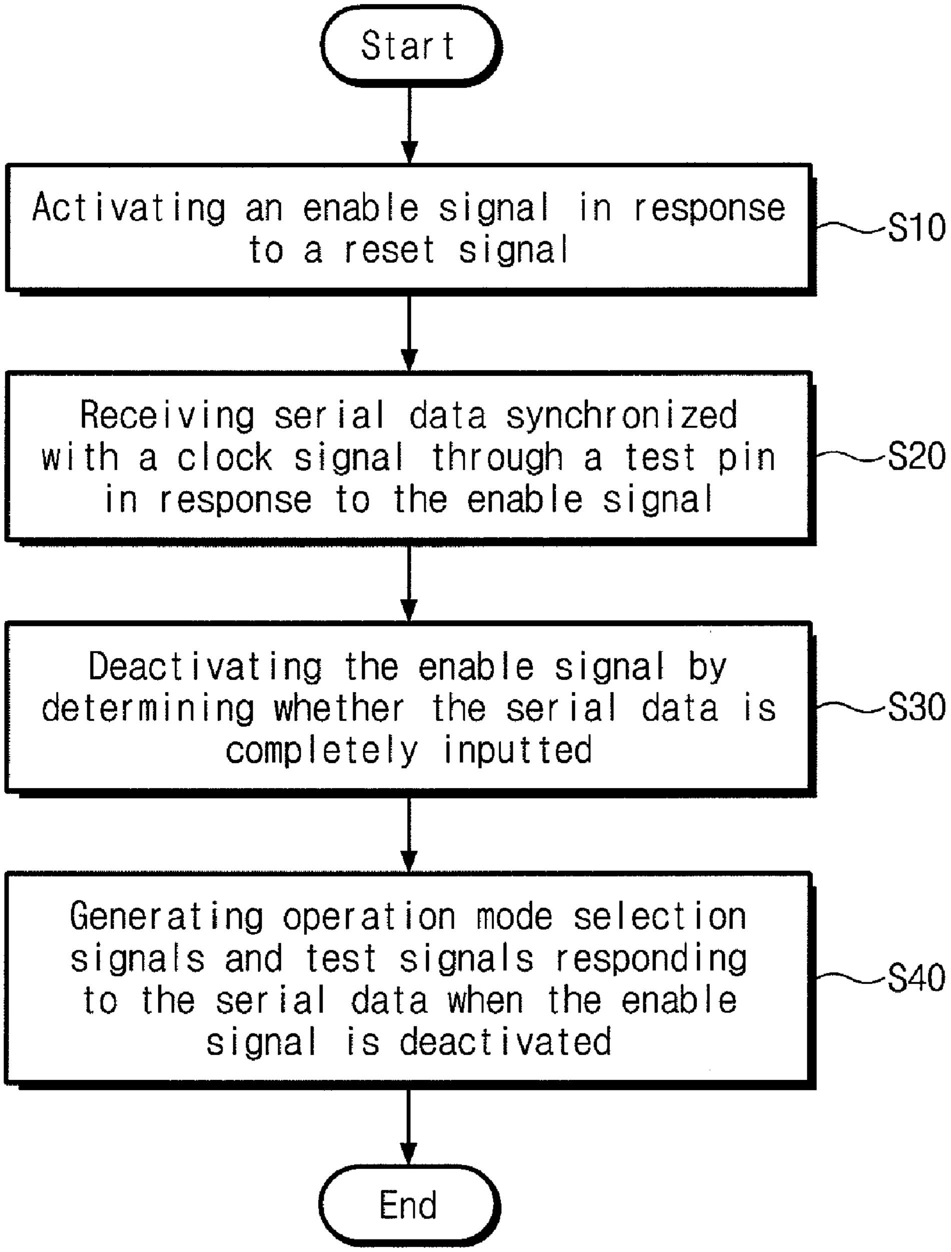
FIG. 12 illustrates a method of testing a semiconductor device in accordance with an exemplary embodiment of the present invention.

FIG. 12 illustrates a method of testing a semiconductor device in accordance with an exemplary embodiment of the present invention. The method includes activating an enable signal in response to a reset signal (S10), receiving serial data synchronized with a clock signal through a test pin in response to the enable signal (S20), deactivating the enable signal by determining whether the serial data is completely inputted (S30), and generating operation mode selection signals and test signals responding to the serial data when the enable signal is deactivated (S40).

According to exemplary embodiments of the present invention, the number of pins used in input/output of test signals is reduced to minimize the size of a system-on-chip and to decrease power consumption.

According to one exemplary embodiment of the present invention, a test mode having various lower operation modes can be set using one specific test pin. In this embodiment, timing of the signals input in respect to a test vector through the one test pin can be adjusted by a clock signal and a reset signal. In addition, the lower operation modes of a specific mode can be set in the chip by means of a plurality of shift registers.

Although the present invention has been described in connection with the exemplary embodiments of the present invention illustrated in the accompanying drawings, it is not limited thereto. It will be apparent to those skilled in the art that various substitutions, modifications and changes may be made thereto without departing from the scope and spirit of the invention.

What is claimed is:

1. A semiconductor device comprising:

a test pin for inputting/outputting data;

an operation mode controller for activating an enable signal in response to an external reset signal and a clock signal;

an operation mode storage for receiving serial data synchronized with the clock signal through the test pin in response to the enable signal;

and an operation mode decoder for generating operation mode selection signals in response to the serial data stored in the operation mode storage, wherein the operation mode storage supplies a portion of the serial data to an internal test module as a test signal.

2. The device of claim 1, wherein the operation mode controller comprises:

a bit counter for counting rising edges of the clock signal in response to a low to high logic level transition of the reset signal; and a comparator for comparing an output value of the bit counter with an operation mode number to activate the enable signal when the output value is smaller than the operation mode number, wherein the operation mode number is determined by the serial data.

3. The device of claim 2, wherein the enable signal is in a high logic level from the low to high logic level transition of the reset signal to when the counted value reaches the operation mode number.

4. The device of claim 3, further comprising a multiplexer for outputting the operation mode selection signals in response to a high to low logic level transition of the enable signal from the operation mode controller.

5. The device of claim 1, wherein the operation mode storage shifts the serial data in response to the enable signal from the operation mode controller.

6. The device of claim 5, wherein the operation mode storage is set to indicate the operation modes.

7. The device of claim 6, wherein the operation modes include a normal operation mode where the semiconductor device performs normal functions.

8. The device of claim 7, wherein the normal operation mode is set in the operation mode storage.

9. The device of claim 5, wherein the operation mode storage is set to indicate lower operation modes belonging to the operation mode and test targets, wherein the test targets are components in the semiconductor device to be tested.

10. The device of claim 9, wherein the test target includes an input/output interface, a memory and an internal logic circuit.

11. The device of claim 1, wherein the reset signal transitions from a low to a high logic level in synchronization with a falling edge of the clock signal.

12. A method of testing a semiconductor device, comprising:

activating an enable signal in response to a reset signal;

receiving serial data synchronized with a clock signal through a test pin in response to the enable signal;

deactivating the enable signal by determining whether the serial data is completely input; and generating operation mode selection signals and test signals responding to the serial data when the enable signal is deactivated.

13. The method of claim 12, wherein the enable signal is activated by a low to high logic level transition and deactivated by a high to low logic level transition.

14. The method of claim 12, wherein the test signals are for indicating lower operation modes of the operation modes set by the operation mode selection signals and test targets.

15. A test circuit, comprising:

an input/output pin for receiving test data;

a delay reset signal generator for delaying a reset signal;

a counter for counting a clock signal in response to the reset signal to generate a counted value;

a mode register for storing the test data;

a decoder for generating selection signals to the mode register to designate a position in the mode register where the test data is written; and an input/output controller comprising:

a first tri-state buffer of which an input terminal is connected to an internal logic circuit and an output terminal is connected to the input/output pin, sending the test data from the internal logic circuit to the input/output pin;

a second tri-state buffer of which an input terminal is connected to the input/output pin and an output terminal is connected to the mode register, sending the test data from the input/output pin to the mode register; and an OR gate of which an output terminal is connected to enable terminals of the first and second tri-state buffers, a first input terminal is connected to the delay reset signal generator and a second input terminal is connected to the counter, wherein the first and second tri-state buffers are enabled by an output signal of the OR gate.

16. The circuit of claim 15, wherein the counter generates a count end signal to the second input terminal of the OR gate when a value of the counter reaches a predetermined value.

17. The circuit of claim 16, wherein the count end signal is in a high logic level.

18. The circuit of claim 15, wherein the delay reset signal generator outputs the delayed reset signal to the first input terminal of the OR gate.

19. The circuit of claim 15, wherein the delay reset signal generator delays the reset signal depending on a number of test modes.

20. The circuit of claim 19, wherein the reset signal is delayed for at least |log.sub.2N| cycles of the clock signal and N is the number of the test modes.

21. The circuit of claim 15, wherein the counter has a value "0" while the reset signal is in a low logic level.

22. A system-on-chip comprising:

an input/output pin for inputting and outputting test data;

a clock input for receiving a clock signal;

a reset input for receiving a reset signal;

a delay reset signal generator for delaying the reset signal to generate a delayed reset signal;

an input/output controller for causing the input/output pin to function as an input pin for a time from a low to high logic level transition of the reset signal to a low to high logic level transition of the delayed reset signal;

a counter for counting the clock signal in synchronization with the low to high logic level transition of the reset signal a mode register for storing the test data in response to selection signals from a decoder;

a first tri-state buffer of which an input terminal is connected to the input/output controller and an output terminal is connected to the input/output pin, sending the output data from the internal logic circuit to the input/output pin;

a second tri-state buffer of which an input terminal is connected to the input/output pin and an output terminal is connected to the mode register, sending the test data from the input/output pin to the mode register; and an OR gate of which an output terminal is connected to enable terminals of the first and second tri-state buffers, a first input terminal is connected to the delay reset signal generator, and a second input terminal is connected to the counter, wherein the first and second tri-state buffers are enabled by an output signal of the OR gate, and wherein the decoder generates the selection signals to the mode register to designate a position in the mode register where the test data from the input/output controller is written depending on an output value of the counter.

23. The system-on-chip of claim 22, wherein the counter generates a count end signal of a high logic level to the second input terminal of the OR gate when the counted value reaches a predetermined value.

24. The system-on-chip of claim 23, wherein the delay reset signal generator delays the reset signal depending on a number of test modes.

25. The system-on-chip of claim 24, wherein the counter has a value "0" while the reset signal is in a low logic level.

26. The system-on-chip of claim 25, wherein the delay reset signal generator delays the reset signal for at least |log.sub.2N| cycles of the clock signal and N is the number of test modes.

27. The system-on-chip of claim 26, further comprising a demultiplexer of which an input terminal is connected to the input/output pin, a first output terminal is connected to the internal logic circuit, and a second output terminal is connected to the mode register, wherein the demultiplexer is enabled by a logical combination of the count end signal and the delayed reset signal and the input/output pin functions as an input pin.

* * * * *